(12) United States Patent
Tang et al.

(10) Patent No.: US 11,996,819 B2
(45) Date of Patent: May 28, 2024

(54) LOW-COST FILTER

(71) Applicant: Huawei Technologies Co., Ltd., Shenzhen (CN)

(72) Inventors: Kaiyu Tang, Shenzhen (CN); Lijie Yan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 58 days.

(21) Appl. No.: 17/562,530

(22) Filed: Dec. 27, 2021

(65) Prior Publication Data

US 2022/0123707 A1 Apr. 21, 2022

Related U.S. Application Data

(63) Continuation of application No. PCT/CN2019/093207, filed on Jun. 27, 2019.

(51) Int. Cl.
*H03H 7/01* (2006.01)
*H04B 1/10* (2006.01)
*H03F 3/19* (2006.01)

(52) U.S. Cl.
CPC .......... *H03H 7/0115* (2013.01); *H04B 1/1018* (2013.01); *H03F 3/19* (2013.01); *H03F 2200/451* (2013.01)

(58) Field of Classification Search
CPC ................. H03H 2001/0085; H03H 7/0115
USPC .................................................. 333/175, 185
See application file for complete search history.

(56) References Cited

U.S. PATENT DOCUMENTS

| 9,564,872 B2 | 2/2017 | Lin | |
|---|---|---|---|
| 2002/0186088 A1 | 12/2002 | Ohta et al. | |
| 2009/0189714 A1* | 7/2009 | Sakisaka | H03H 7/0115 |
| | | | 333/185 |
| 2010/0327965 A1* | 12/2010 | Fagg | H03H 15/00 |
| | | | 327/552 |
| 2014/0232483 A1* | 8/2014 | Correa | H01P 3/08 |
| | | | 29/601 |
| 2014/0292443 A1 | 10/2014 | Nosaka | |
| 2016/0352310 A1 | 12/2016 | Tani et al. | |

(Continued)

FOREIGN PATENT DOCUMENTS

| CN | 101246983 A | 8/2008 |
|---|---|---|
| CN | 101453828 A | 6/2009 |

(Continued)

OTHER PUBLICATIONS

Qian, L., et al., "Investigating on Through Glass via Based RF Passives for 3-D Integration," IEEE Journal of the Electron Devices Society, vol. 6, Jun. 21, 2018, 5 pages. XP011686774.

*Primary Examiner* — Rakesh B Patel
(74) *Attorney, Agent, or Firm* — Conley Rose, P.C.

(57) ABSTRACT

A filter includes: an input terminal configured to receive a radio frequency signal, and an output terminal of the filter configured to output the radio frequency signal obtained after filtering. The filter further includes a first filter capacitor and a first ground via. The first filter capacitor is disposed in a substrate or on a surface of a substrate. A first terminal of the first filter capacitor is coupled to the input terminal or the output terminal of the filter, a second terminal of the first filter capacitor is coupled to a terminal of the first ground via disposed in the substrate, and another terminal of the first ground via is coupled to a ground.

20 Claims, 5 Drawing Sheets

(56) References Cited

U.S. PATENT DOCUMENTS

2017/0331444 A1  11/2017  Mori
2018/0034436 A1* 2/2018  Masuda ................. H03H 7/03

FOREIGN PATENT DOCUMENTS

| CN | 101295808 B | 7/2012 |
| CN | 103595364 A | 2/2014 |
| CN | 105514094 A | 4/2016 |
| CN | 106099280 A | 11/2016 |
| CN | 107658532 A | 2/2018 |
| CN | 108988816 A | 12/2018 |
| JP | 2009021725 A | 1/2009 |
| WO | 2009090917 A1 | 7/2009 |
| WO | 2015119176 A1 | 8/2015 |

* cited by examiner

LOW-COST FILTER

CROSS-REFERENCE TO RELATED APPLICATIONS

This application is a continuation of International Patent Application No. PCT/CN2019/093207, filed on Jun. 27, 2019, the disclosure of which is hereby incorporated by reference in its entirety.

TECHNICAL FIELD

This application relates to circuit technologies, and in particular, to a low-cost filter.

BACKGROUND

With rapid development of wireless communication technologies, a signal transmission device in a wireless communication system needs to meet more stringent requirements. In the signal transmission device, because of a nonlinear characteristic of a power amplifier (PA), a radio frequency (RF) signal output by the power amplifier carries a harmonic signal whose main harmonics are a second harmonic and a third harmonic. Consequently, performance of the wireless communication system is affected. By coupling a matching circuit to an output terminal of the power amplifier to implement a low pass filter (LPF), the second harmonic and the third harmonic can be suppressed. The LPF may be implemented using an integrated circuit, but costs are high. At present, more manufacturers tend to use capacitors and inductors to build LPFs to meet related filtering requirements.

One LPF usually includes a plurality of capacitors and inductors. FIG. 1 is a circuit diagram of a structure of an LPF according to a conventional technology. A capacitor C11 and an inductor L11 that are connected in series and a capacitor C12 and an inductor L12 that are connected in series are connected in parallel between an input terminal Vin and an inductor L14. A capacitor C13 is connected in series with an inductor L13. A terminal of the capacitor C13 is coupled to an output terminal Vout and is coupled to a terminal of the inductor L14. A terminal of the inductor L13 is coupled to the capacitor C13, and another terminal of the inductor L13 is connected to a ground. The LPF corresponds to three resonance frequencies. Therefore, values of the foregoing capacitors and inductors may be adjusted to separately determine three resonance frequency bins, in order to filter out harmonics of corresponding frequencies. The LPF in FIG. 1 uses three capacitor components and four inductor components. Because costs of a chip cascading capacitor and inductor are constantly increasing and the costs of the cascading inductor are higher than the costs of the cascading capacitor, how to reduce the costs of the inductor component while ensuring performance of the LPF becomes an urgent problem to be resolved.

SUMMARY

Embodiments of this application provide a filter, in which a filter inductor component may be replaced with a ground via to reduce costs of the filter.

According to a first aspect, an embodiment of this application provides a filter. The filter includes: a first filter capacitor disposed in a substrate or on a surface of a substrate, where a first terminal of the first filter capacitor is coupled to an input terminal or an output terminal of the filter; and a first ground via disposed in the substrate, where a first terminal of the first ground via is coupled to a second terminal of the first filter capacitor, and where a second terminal of the first ground via is coupled to a ground. The input terminal is configured to receive a radio frequency signal, and the output terminal is configured to output the radio frequency signal obtained after filtering. The filter capacitor may be a capacitor component disposed on a signal layer of the substrate.

The first ground via generates a parasitic inductance effect, that is, is equivalent to a parasitic inductor, and a conducting wire between the first ground via and the first filter capacitor also generates a parasitic inductor. These parasitic inductors may be used as inductors during resonance. Therefore, a filter inductor component on a substrate in a conventional technology may be replaced with the first ground via. On the basis that a parasitic inductance may be adjusted using a method such as changing a parameter of the first ground via, the first ground via can implement a function of the filter inductor component. In this way, an area originally occupied by the filter inductor component is reduced, and costs of components are reduced.

In a possible implementation, the filter further includes at least one second ground via that is disposed in the substrate and that is connected in parallel to the first ground via. In one embodiment, a first terminal of each second ground via is coupled to the second terminal of the first filter capacitor, and a second terminal of the second ground via is coupled to the ground. The second ground via is disposed on the basis of the first ground via, such that an equivalent parasitic inductance becomes smaller, thereby facilitating flexible adjustment on the parasitic inductance.

In a possible implementation, the filter further includes a first filter inductor disposed in the substrate or on the surface of the substrate. The first terminal of the first filter capacitor is coupled to the output terminal, and the first terminal of the first filter capacitor is coupled to the input terminal through the first filter inductor. The first filter inductor, the first filter capacitor, and the first ground via form a low pass filter, which can filter out a harmonic in the radio frequency signal.

In a possible implementation, the filter further includes a first filter inductor disposed in the substrate or on the surface of the substrate. The first terminal of the first filter capacitor is coupled to the input terminal, and the first terminal of the first filter capacitor is coupled to the output terminal through the first filter inductor. The first filter inductor, the first filter capacitor, and the first ground via form a low pass filter, which can filter out a harmonic in the radio frequency signal.

In a possible implementation, the filter further includes a second filter inductor disposed in the substrate or on the surface of the substrate. The first terminal of the first filter capacitor is coupled to the input terminal through the second filter inductor. The second filter inductor can further improve filtering performance of the filter.

In a possible implementation, the filter further includes a second filter capacitor disposed in the substrate or on the surface of the substrate and a second ground via disposed in the substrate. A first terminal of the second filter capacitor is coupled to the output terminal, and the first terminal of the second filter capacitor is coupled to the input terminal through the first filter inductor. A first terminal of the second ground via is coupled to a second terminal of the second filter capacitor, and a second terminal of the second ground via is coupled to the ground. The filter includes two resonance frequencies. One resonance frequency is mainly determined using the first filter capacitor and a parasitic inductance of the first ground via. The other resonance frequency is mainly determined using the second filter capacitor and a parasitic inductance of the second ground via. The foregoing two resonance frequencies are set at a frequency of a harmonic that is expected to be removed, such that the harmonic at the corresponding frequency can be filtered out.

In a possible implementation, the filter further includes a third filter capacitor disposed in the substrate or on the surface of the substrate and a third ground via disposed in the substrate. A first terminal of the third filter capacitor is coupled to the input terminal, and the first terminal of the third filter capacitor is coupled to the output terminal through the first filter inductor. A first terminal of the third ground via is coupled to a second terminal of the third filter capacitor, and the second terminal of the third ground via is coupled to the ground. The filter further includes a third resonance frequency, which is mainly determined using the third filter capacitor and a parasitic inductance of the third ground via. The foregoing three resonance frequencies are set at a frequency of a harmonic that is expected to be removed, such that the harmonic at the corresponding frequency can be filtered out.

In a possible implementation, the filter further includes a second filter inductor disposed in the substrate or on the surface of the substrate. The second filter inductor is coupled to the first terminal of the second filter capacitor and the first terminal of the third filter capacitor. The second filter inductor can further improve filtering performance of the filter.

In a possible implementation, the first terminal of the first filter capacitor is coupled to the input terminal, and the second terminal of the first filter capacitor is coupled to the output terminal. The first filter inductor, the first filter capacitor, and the first ground via form a high pass filter, which can filter out a low frequency component in a radio frequency signal.

In a possible implementation, the filter further includes a second filter capacitor and a first filter inductor that are disposed in the substrate or on the surface of the substrate. The first terminal of the first filter capacitor is coupled to the ground. The second terminal of the first filter capacitor is separately coupled to the output terminal, the first terminal of the first ground via, and the first terminal of the second filter capacitor through the first filter inductor. A second terminal of the second filter capacitor is coupled to the ground. The second filter capacitor, the first filter inductor, the first filter capacitor, and the first ground via form a band-pass filter, which can filter out a signal beyond a frequency range in a radio frequency signal.

In a possible implementation, the filter further includes a second filter capacitor and a first filter inductor that are disposed in the substrate or on the surface of the substrate. The first terminal of the first filter capacitor is coupled to the input terminal through the second filter capacitor and the first filter inductor that are connected in parallel, and the first terminal of the first filter capacitor is coupled to the output terminal. The second filter capacitor, the first filter inductor, the first filter capacitor, and the first ground via form a band-stop filter, which can filter out a signal within a frequency range in a radio frequency signal.

In a possible implementation, a dominant frequency range of the radio frequency signal is 1 gigahertz (GHz) to 3 GHz. When a dominant frequency at which the radio frequency signal is located in within the foregoing range, debugging consistency of the filter is better.

In a possible implementation, a dominant frequency bandwidth of the radio frequency signal is less than 100 megahertz (MHz). When a dominant frequency bandwidth in which the radio frequency signal is located is less than 100 MHz, a filtering effect of the filter is better.

In a possible implementation, at least one of the first ground via, the second ground via, the third ground via, and the fourth ground via is a through hole.

In a possible implementation, the substrate is a substrate implemented using a copper clad laminate.

In a possible implementation, the substrate may be an interposer implemented using a passive silicon chip.

According to a second aspect, an embodiment of this application provides a low-cost filter. The low-cost filter includes: a first filter capacitor, a first filter inductor, and a first ground via. A first terminal of the first filter capacitor is coupled to an input terminal and an output terminal of the filter, and a second terminal of the first filter capacitor is coupled to a ground through the first ground via. The first filter inductor is coupled between the input terminal and the output terminal. The first filter capacitor and the first filter inductor are disposed in a substrate or on a surface of a substrate. The first ground via is disposed in the substrate.

The first ground via generates a parasitic inductance effect, that is, is equivalent to a parasitic inductor, and a conducting wire between the first ground via and the first filter capacitor also generates a parasitic inductor. These parasitic inductors may be used as inductors during resonance. Therefore, a filter inductor component on a substrate in a conventional technology may be replaced with the first ground via. On the basis that a parasitic inductance may be adjusted using a method such as changing a parameter of the first ground via, the first ground via can implement a function of the filter inductor component. In this way, an area originally occupied by the filter inductor component is reduced, and costs of components are reduced.

In a possible implementation, the filter further includes a second filter inductor disposed in the substrate or on the surface of the substrate. The first terminal of the first filter capacitor is coupled to the input terminal through the second filter inductor. The second filter inductor can further improve filtering performance of the filter.

In a possible implementation, the filter further includes a second filter capacitor disposed in the substrate or on the surface of the substrate and a second ground via disposed in the substrate. A first terminal of the second filter capacitor is coupled to the output terminal, and the first terminal of the second filter capacitor is coupled to the input terminal through the first filter inductor. A first terminal of the second ground via is coupled to a second terminal of the second filter capacitor, and a second terminal of the second ground via is coupled to the ground. The filter includes two resonance frequencies. One resonance frequency is mainly determined using the first filter capacitor and a parasitic inductance of the first ground via. The other resonance frequency is mainly determined using the second filter capacitor and a parasitic inductance of the second ground via. The foregoing two resonance frequencies are set at a frequency of a harmonic that is expected to be removed, such that the harmonic at the corresponding frequency can be filtered out.

In a possible implementation, the filter further includes a third filter capacitor disposed in the substrate or on the surface of the substrate and a third ground via disposed in the substrate. A first terminal of the third filter capacitor is coupled to the input terminal, and the first terminal of the third filter capacitor is coupled to the output terminal through the first filter inductor. A first terminal of the third ground via is coupled to a second terminal of the third filter capacitor, and the second terminal of the third ground via is coupled to the ground. The filter further includes a third resonance frequency, which is mainly determined using the third filter capacitor and a parasitic inductance of the third ground via. The foregoing three resonance frequencies are set at a frequency of a harmonic that is expected to be removed, such that the harmonic at the corresponding frequency can be filtered out.

In a possible implementation, the filter further includes a second filter inductor disposed in the substrate or on the surface of the substrate. The second filter inductor is coupled to the first terminal of the second filter capacitor and the first terminal of the third filter capacitor. The second filter inductor can further improve filtering performance of the filter.

In a possible implementation, the first terminal of the first filter capacitor is coupled to the input terminal, and the second terminal of the first filter capacitor is coupled to the output terminal. The first filter inductor, the first filter capacitor, and the first ground via form a high pass filter, which can filter out a low frequency component in a radio frequency signal.

In a possible implementation, the filter further includes a second filter capacitor and a first filter inductor that are disposed in the substrate or on the surface of the substrate. The first terminal of the first filter capacitor is coupled to the ground. The second terminal of the first filter capacitor is separately coupled to the output terminal, the first terminal of the first ground via, and the first terminal of the second filter capacitor through the first filter inductor. A second terminal of the second filter capacitor is coupled to the ground. The second filter capacitor, the first filter inductor, the first filter capacitor, and the first ground via form a band-pass filter, which can filter out a signal beyond a frequency range in a radio frequency signal.

In a possible implementation, the filter further includes a second filter capacitor and a first filter inductor that are disposed in the substrate or on the surface of the substrate. The first terminal of the first filter capacitor is coupled to the input terminal through the second filter capacitor and the first filter inductor that are connected in parallel, and the first terminal of the first filter capacitor is coupled to the output terminal. The second filter capacitor, the first filter inductor, the first filter capacitor, and the first ground via form a band-stop filter, which can filter out a signal within a frequency range in a radio frequency signal.

In a possible implementation, a dominant frequency range of the radio frequency signal is 1 GHz to 3 GHz. When a dominant frequency at which the radio frequency signal is located in within the foregoing range, debugging consistency of the filter is better.

In a possible implementation, a dominant frequency bandwidth of the radio frequency signal is less than 100 MHz. When a dominant frequency bandwidth in which the radio frequency signal is located is less than 100 MHz, a filtering effect of the filter is better.

In a possible implementation, at least one of the first ground via, the second ground via, the third ground via, and the fourth ground via is a through hole.

In a possible implementation, the substrate is a substrate implemented using a copper clad laminate.

In a possible implementation, the substrate may be an interposer implemented using a passive silicon chip.

According to a third aspect, an embodiment of this application provides a low-cost filter. The low-cost filter is configured to filter a radio frequency signal and includes: a first filter capacitor and a first ground via. A first terminal of the first filter capacitor is coupled to an input terminal of the filter, and a second terminal of the first filter capacitor is coupled to an output terminal of the filter and is coupled to a ground through the first ground via. The first filter capacitor is disposed in a substrate or on a surface of a substrate. The first ground via is disposed in the substrate.

According to a fourth aspect, an embodiment of this application provides a low-cost filter. The low-cost filter is configured to filter a radio frequency signal and includes: a first filter capacitor, a first ground via, a second filter capacitor, and a first filter inductor. A first terminal of the first filter capacitor is coupled to a ground, and a second terminal of the first filter capacitor is coupled to an output terminal of the filter and is coupled to an input terminal of the filter through the second filter capacitor and the first filter inductor that are connected in series. A first terminal of the first ground via is coupled to the second terminal of the first filter capacitor, and a second terminal of the first ground via is coupled to the ground. The first filter capacitor, the second filter capacitor, and the first filter inductor are disposed in a substrate or on a surface of a substrate. The first ground via is disposed in the substrate.

According to a fifth aspect, an embodiment of this application provides a low-cost filter. The low-cost filter is configured to filter a radio frequency signal and includes: a first filter capacitor, a first ground via, a second filter capacitor, and a first filter inductor. A first terminal of the first filter capacitor is coupled to an input terminal through the second filter capacitor and the first filter inductor that are connected in parallel and is coupled to an output terminal. A second terminal of the first filter capacitor is coupled to a ground through the first ground via. The first filter capacitor, the second filter capacitor, and the first filter inductor are disposed in a substrate or on a surface of a substrate. The first ground via is disposed in the substrate.

According to a sixth aspect, an embodiment of this application provides a radio frequency signal processing circuit. The radio frequency signal processing circuit includes a signal amplifier and a filter. An output terminal of the signal amplifier is coupled to an input terminal of the filter, and the filter is the filter according to any possible implementation of the first aspect to the fifth aspect.

DESCRIPTION OF EMBODIMENTS

The following clearly describes technical solutions in embodiments of this application with reference to accompanying drawings in the embodiments of this application.

Figure 1:
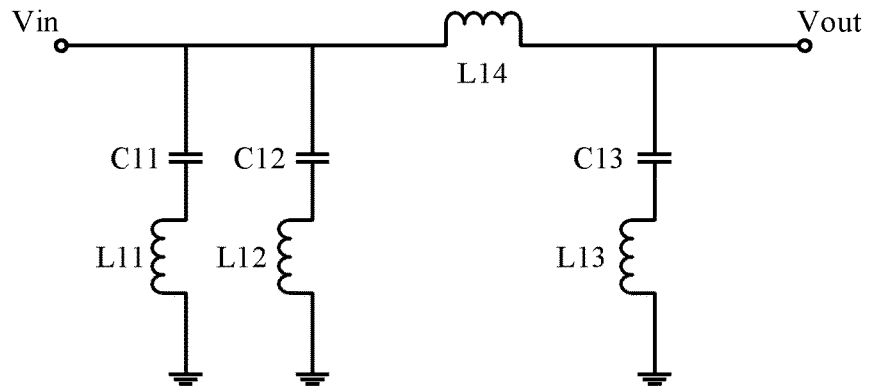
FIG. 1 is a circuit diagram of a structure of an LPF according to a conventional technology.
Figure 2:
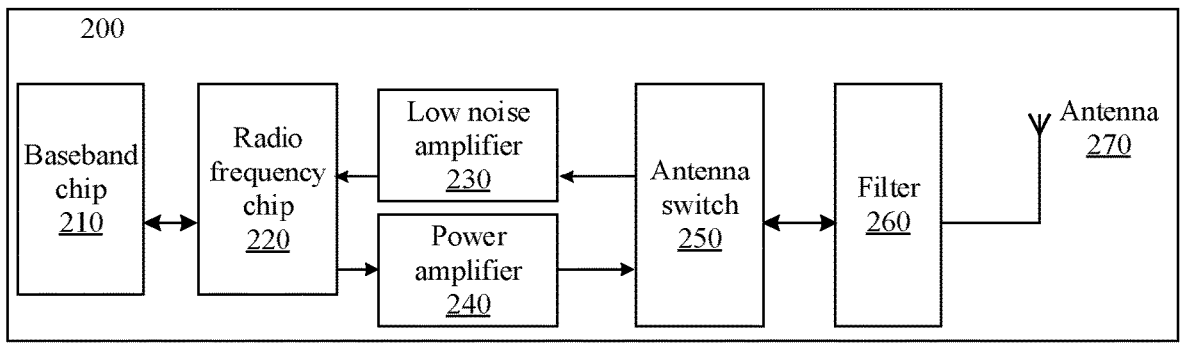
FIG. 2 shows a communication device according to an embodiment of this application.

An embodiment of this application provides a communication device 200 shown in FIG. 2. The communication device 200 may be a mobile phone, a fixed phone, or a device with a wireless communication function such as a tablet computer, a portable computer, a smart watch, or a smart home. The communication device 200 may include a baseband (BB) chip 210, a radio frequency (RF) chip 220, a low noise amplifier (LNA) 230, a power amplifier (PA) 240, an antenna switch 250, a filter 260, and an antenna 270. It may be understood that the components illustrated in this embodiment of this application do not constitute a limitation on the communication device 200. In some other embodiments of this application, the communication device 200 may include more or fewer components than those shown in the figure, or combine some components, or split some components, or have different component arrangements. The components shown in the figure may be implemented using hardware, software, or a combination of software and hardware.

In one embodiment, the baseband chip 210 may be configured to: support processing of a protocol stack; support a plurality of communication standards using components such as a digital signal processor (DSP), a micro controller unit (MCU), and a memory inside the baseband chip 210; and provide a multimedia function and interfaces used for a multimedia display, an image sensor, and an audio device. The baseband chip 210 may be coupled to the radio frequency chip 220. The radio frequency chip 220 may include components such as a frequency mixer, a transformer, and a variable gain amplifier. The radio frequency chip 220 is configured to: up-convert a baseband or intermediate frequency signal provided by the baseband chip 210 into an RF signal for sending to the PA 240, and down-convert the RF signal sent by the LNA 230 into the baseband or intermediate frequency signal for processing by the baseband chip 210. The PA 240 may be configured to amplify an RF signal of a transmit channel. The LNA 230 may be configured to amplify an RF signal of a receive channel. The antenna switch 250 may be configured to: receive, send, and convert an RF signal, and switch between different frequency bands. The filter 260 may be configured to: reserve a signal within a particular frequency band, and filter out a signal beyond the particular frequency band. For example, the filter 260 may be configured to implement a function of a low pass filter to filter out a harmonic signal; and may further be configured to implement a function of a high pass filter, a band-pass filter, or a band-stop filter. The antenna 270 is configured to radiate and receive a wireless signal. The communication device 200 may provide solutions of wireless communication such as $2^{nd}$ generation (2G)/$3^{rd}$ generation (3G)/$4^{th}$ generation (4G)/$5^{th}$ generation (5G).

An embodiment of this application provides a filter 260 configured to filter a radio frequency signal and including: an input terminal, an output terminal, a first filter capacitor, and a first ground via. The input terminal, the output terminal, and the first filter capacitor are disposed in a substrate or on a surface of a substrate, and the first ground via is disposed in the substrate. The input terminal is configured to receive a radio frequency signal, and the output terminal is configured to output the radio frequency signal obtained after filtering. The first filter capacitor may be disposed on a signal layer, a first terminal of the first filter is coupled to the input terminal or the output terminal, a second terminal of the first filter is coupled to a first terminal of the first ground via, and a second terminal of the first ground via is coupled to a ground.

Figure 3A:
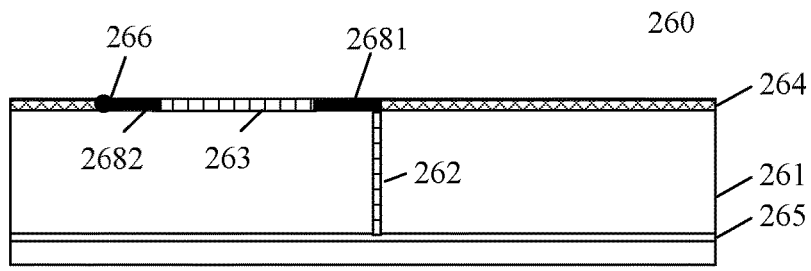
FIG. 3A is a sectional view of a filter according to an embodiment of this application.
Figure 3B:
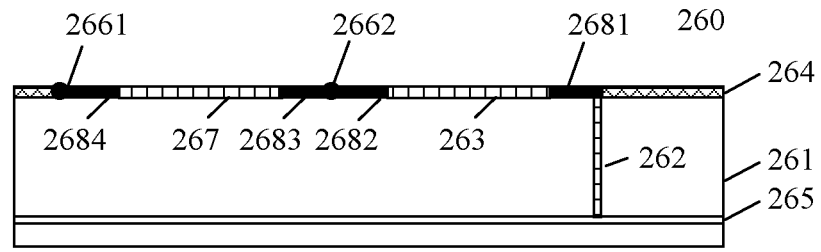
FIG. 3B is a sectional view of another filter according to an embodiment of this application.

FIG. 3A is a sectional view of a filter 260. In an implementation, a first filter capacitor 263, an input terminal (or an output terminal) 266 may be disposed on a signal layer 264 on a surface of a substrate 261. A first terminal of a first ground via 262 is coupled to a second terminal of a first filter capacitor 263 on the signal layer 264 through a conducting wire 2681. A second terminal of the first ground via 262 is coupled to a ground layer 265. A first terminal of the first filter capacitor 263 is coupled to the input terminal (or the output terminal) 266 through a conducting wire 2682. FIG. 3B is a sectional view of another filter 260. In another implementation, a first filter capacitor 263 may be disposed on a signal layer 264 on a surface of a substrate 261. A first terminal of a first ground via 262 is coupled to a second terminal of the first filter capacitor 263 on the signal layer 264 through a conducting wire 2681. A second terminal of the first ground via 262 is coupled to a ground layer 265. A first terminal of the first filter capacitor 263 is coupled to an output terminal 2662 through a conducting wire 2682, and the first terminal of the first filter capacitor 263 is coupled to an input terminal 2661 through a conducting wire 2683, a filter inductor 267, and a conducting wire 2684. It may be understood that the sectional views shown in FIG. 3A and FIG. 3B are merely examples. A layout or a position of a line layer, a ground layer, a power layer, or a conducting wire in the substrate is not limited in this application. In addition, in this application, coupling may be a direct connection between components, ports, nodes, or other components; or may be an electrical connection implemented through a conducting wire or an electrical connection implemented through another component such as a resistor or a capacitor.

In an implementation, the filter 260 may be disposed on a printed circuit board (PCB) as a discrete component, the first filter capacitor 263 may be a patch capacitor, and the substrate 261 may be a substrate implemented using a copper clad laminate. In another implementation, the filter 260 may be encapsulated in an application-specific integrated circuit (ASIC), and the substrate 261 may be an interposer implemented using a passive silicon chip. In an implementation, the ground via may be a through hole, a buried via, or a blind via.

A filter implements a function of filtering out a signal within a frequency range using a filter capacitor and a filter inductor. For example, a capacitance of a filter capacitor and an inductance of a filter inductor in a low pass filter are adjusted to determine a resonance frequency f of the low pass filter. In this way, a harmonic whose frequency is f can be filtered out. In this embodiment of this application, when a frequency of a radio frequency signal is within a range, the first ground via 262 generates a parasitic inductance effect, in other words, the first ground via 262 is equivalent to a parasitic inductor connected in series with the first filter capacitor. Because an inductance of the parasitic inductor may be adjusted by adjusting a height and a diameter of the first ground via 262, a controllable parasitic inductor generated by the first ground via 262 may be used to replace an inductor component in a conventional technology, such that the filter 260 uses fewer inductor components, thereby reducing an area of the filter 260 and reducing costs.

In a possible implementation, a frequency range of a dominant frequency of the radio frequency signal is 1 GHz to 3 GHz. In this case, debugging consistency of the filter is better.

In a possible implementation, a dominant frequency bandwidth of the radio frequency signal is less than 100 MHz. The filter has better filtering performance for a radio frequency signal with a dominant frequency bandwidth less than 100 MHz.

It should be noted in this embodiment of this application, the filter capacitor and the filter inductor may be disposed on a surface of the substrate, for example, may be located on a signal layer on the top of the substrate; or may be disposed in the substrate, for example, may be located on a signal layer inside the substrate. In this embodiment of this application, the ground via is disposed in the substrate.

Figure 4A:
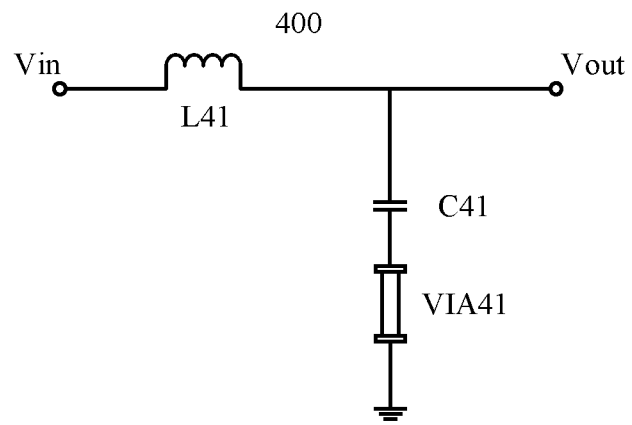
FIG. 4A is a circuit diagram of a structure of a filter according to an embodiment of this application.

FIG. 4A shows a filter 400 according to an embodiment of this application. The filter 400 can implement a function of low pass filtering. The filter 400 includes: a filter inductor L41, a filter capacitor C41, and a ground via VIA41. A first terminal of the filter capacitor C41 is coupled to an output terminal Vout and is coupled to an input terminal Vin through the filter inductor L41. A first terminal of the ground via VIA41 is coupled to a second terminal of the filter capacitor C41, and a second terminal of the ground via VIA41 is coupled to a ground. The filter inductor L41 and the filter capacitor C41 are disposed in a substrate or on a surface of a substrate. The ground via VIA41 is disposed in the substrate.

Figure 4B:
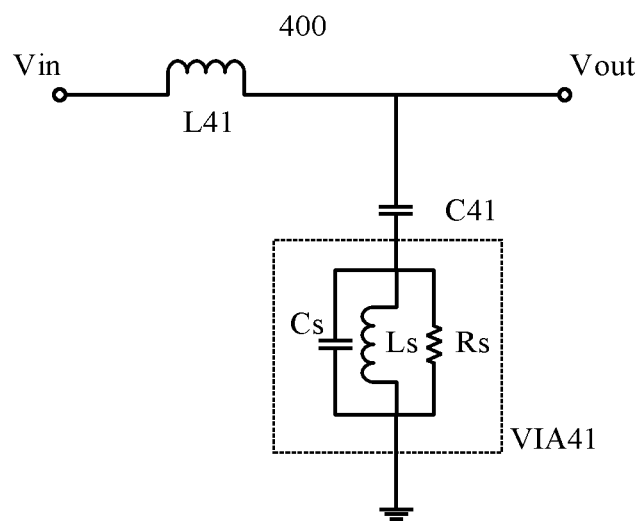
FIG. 4B is an equivalent circuit diagram of a filter according to an embodiment of this application.

FIG. 4B shows an equivalent circuit of the filter 400. The ground via VIA41 may be equivalent to a parasitic capacitor Cs, a parasitic inductor Ls, and a parasitic resistor Rs that are connected in parallel. In one embodiment, an inductance of the parasitic inductor Ls may be expressed as Ls=H/5×[ln (4H/D)+1] nH, where H (unit: millimeters (mm)) is a distance between the first terminal (that is, the terminal far away from a ground layer) of the ground via VIA41 and the ground layer, and D (unit: mm) is a diameter (that is, an inner diameter) of the ground via VIA41. As can be learned from the expression of Ls, the parasitic inductance Ls is greatly affected by H and is slightly affected by D. Therefore, the inductance of the parasitic inductor Ls may be changed mainly by adjusting H. In addition, the filter capacitor C41 is coupled to the filter inductor L41 through a conducting wire. The conducting wire generates a conducting wire parasitic inductor L0 connected in series with the ground via VIA41, and a conducting wire parasitic inductance thereof may be expressed as L0=2×l×[ln(2×l/ w)+0.5+0.2235×w/l] nH, where l is a length (unit: centimeters (cm)) of the conducting wire between the filter capacitor C41 and the filter inductor L41, and w is a width (unit: cm) of the conducting wire. In conclusion, by calculating a sum of the parasitic inductance Ls and the conducting wire parasitic inductance L0, it can be obtained that a total inductance is L=Ls+L0.

When the filter 400 performs filtering, the filter inductor L41 and the filter capacitor C41 generate resonances. A change periodicity of voltages at two terminals of each of the filter inductor L41 and the filter capacitor C41 thereof is a resonant periodicity, and a reciprocal of the resonant periodicity is a resonance frequency f. A calculation formula of the resonance frequency f is:

$$f = \frac{1}{2\pi\sqrt{LC}}$$

L is the total inductance L=Ls+L0, and C is a capacitance C41 of the filter capacitor. Therefore, according to the foregoing formula, by adjusting values of L and C, the resonance frequency of the filter 400 can be determined to determine a frequency of a harmonic that may be filtered out.

In addition, the parasitic capacitor Cs equivalent to the ground via VIA41 affects the foregoing resonance frequency. In one embodiment, the ground via VIA41 generates a parasitic capacitor, and a capacitance thereof may be expressed as Cs≈1.41×ε×H×D1/(D2−D1) pf, where ε is a dielectric constant of a substrate, H (unit: mm) is a distance between the first terminal (that is, the terminal far away from a ground) of the ground via VIA41 and the ground layer, D1 (unit: inch) is a diameter (that is, an outer diameter) of the ground via VIA41, and D2 (unit: inch) is a diameter of a solder resist region of the ground via VIA41 on the ground layer. The resonance frequency f may deviate due to existence of the parasitic capacitor Cs. Therefore, a value of the filter capacitor C41 needs to be adjusted based on an actual situation. If the resonance frequency f is extremely large, a value of the filter capacitor C41 may be increased to reduce the resonance frequency f. Correspondingly, if the resonance frequency f is extremely small, a value of the filter capacitor C41 may be reduced to increase the resonance frequency f.

The ground via VIA41 and the conducting wire between the ground via VIA41 and the filter capacitor C41 may generate parasitic inductances. Therefore, a filter inductor component on a substrate in a conventional technology may be replaced with the ground via VIA41. On the basis that a parasitic inductance may be adjusted using the foregoing method, the ground via VIA41 may replace an original filter inductor component to implement a function of the filter inductor component. In this way, an area originally occupied by the filter inductor component is reduced, and costs of components of the filter are reduced.

In an implementation, the filter 400 may further include at least one parallel ground via. The parallel ground via is connected in parallel to the ground via VIA41, in one embodiment, one terminal is coupled to a connection point between the ground via VIA41 and the filter capacitor C41, and another terminal is coupled to a ground. The at least one parallel ground via is connected in parallel to the ground via VIA41, such that a total inductance becomes smaller. Therefore, a quantity of parallel ground vias may be adjusted based on a frequency of a harmonic that needs to be filtered out, in order to reduce a resonance frequency of the filter.

In an implementation, the ground via is a through hole. Because vias in forms of through holes have better processing consistency facilitate debugging, the costs can further be reduced and mass production is facilitated.

It may be understood that the foregoing features of the parallel ground via and the ground via VIA41 are not limited to the filter 400. In this application, the calculation methods for the parasitic inductor Ls, the conducting wire parasitic inductance L0, and the resonance frequency, and the features of the ground via VIA41 and the parallel ground via is applicable to any embodiment of this application.

Figure 5:
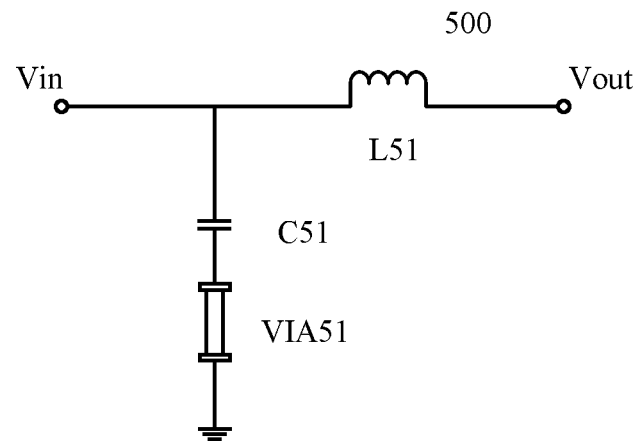
FIG. 5 is a circuit diagram of a structure of another filter according to an embodiment of this application.

FIG. 5 shows another filter 500 according to an embodiment of this application. The filter 500 can implement a function of low pass filtering. The filter 500 includes: a filter inductor L51, a filter capacitor C51, and a ground via VIA51. A first terminal of the filter capacitor C51 is coupled to an input terminal Vin and is coupled to an output terminal Vout through the filter inductor L51. A first terminal of the ground via VIA51 is coupled to a second terminal of the filter capacitor C51, and a second terminal of the ground via VIA51 is coupled to a ground. The filter inductor L51 and the filter capacitor C51 are disposed in a substrate or on a surface of a substrate. The ground via VIA51 is disposed in the substrate.

Figure 6:
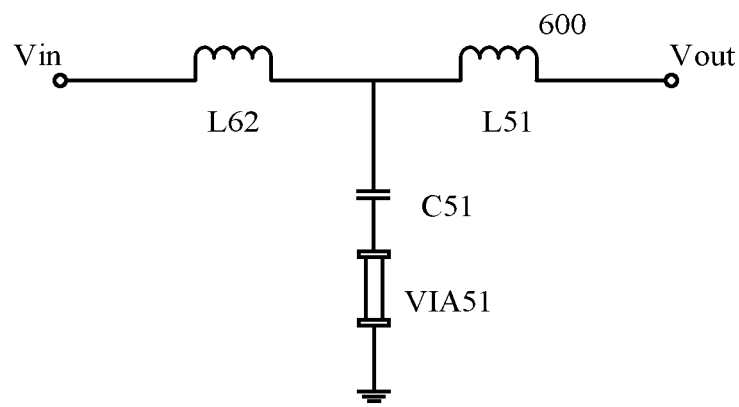
FIG. 6 is a circuit diagram of a structure of a filter according to an embodiment of this application.

In one embodiment, FIG. 6 shows another filter 600 according to an embodiment of this application. The filter 600 is similar to the filter 500. A difference is that the filter 600 further includes a filter inductor L62. The filter inductor L62 is coupled to an input terminal Vin and a first terminal of a filter inductor L51, that is, a first terminal of a filter capacitor C51 is coupled to the input terminal Vin through the filter inductor L62. The filter inductor L62 makes filtering performance of the filter 600 better. The filter inductor L62 is disposed in a substrate or on a surface of a substrate.

Figure 7:
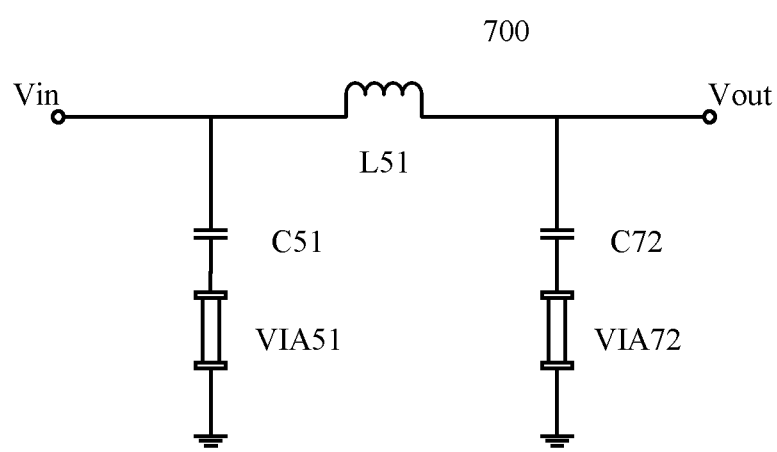
FIG. 7 is a circuit diagram of a structure of still another filter according to an embodiment of this application.

FIG. 7 shows still another filter 700 according to an embodiment of this application. The filter 700 is similar to the filter 500. A difference is that the filter 700 further includes a filter capacitor C72 and a ground via VIA72. A first terminal of the filter capacitor C72 is coupled to an output terminal Vout and is coupled to an input terminal Vin through a filter inductor L51. A first terminal of the ground via VIA72 is coupled to a second terminal of the filter capacitor C72, and a second terminal of the ground via VIA72 is coupled to a ground. The filter capacitor C72 is disposed in a substrate or on a surface of a substrate. The ground via VIA72 is disposed in the substrate.

The filter 700 includes two resonance frequencies. One resonance frequency is determined using the filter capacitor C51, a parasitic inductance of a ground via VIA51, and a parasitic inductance of a conducting wire between the filter capacitor C51 and the ground via VIA51. The other resonance frequency is determined using the filter capacitor C72, a parasitic inductance of the ground via VIA72 and a parasitic inductance of a conducting wire between the filter capacitor C72 and the ground via VIA72. The foregoing two resonance frequencies are set at a frequency of a harmonic that is expected to be removed, such that the harmonic at the corresponding frequency can be filtered out.

Figure 8:
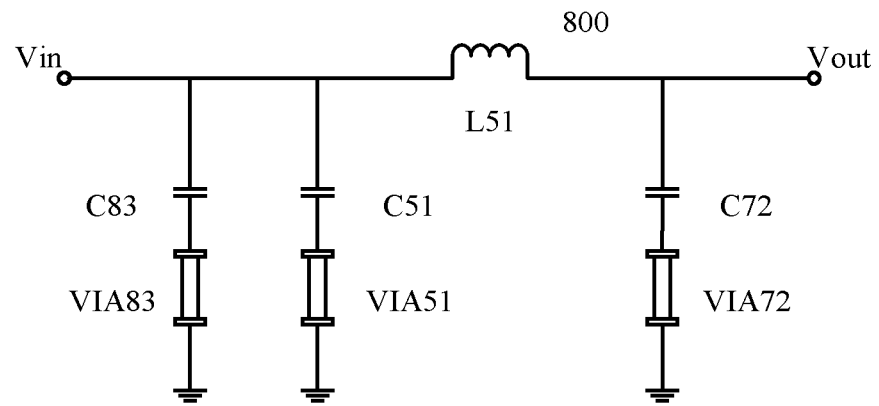
FIG. 8 is a circuit diagram of a structure of still another filter according to an embodiment of this application.

FIG. 8 shows still another filter 800 according to an embodiment of this application. The filter 800 is similar to the filter 700. A difference is that the filter 800 further includes a filter capacitor C83 and a ground via VIA83. A first terminal of the filter capacitor C83 is coupled to an input terminal Vin and is coupled to an output terminal Vout through a filter inductor L51. A first terminal of the ground via VIA83 is coupled to a second terminal of the filter capacitor C83, and a second terminal of the ground via VIA83 is coupled to a ground. The filter capacitor C83 is disposed in a substrate or on a surface of a substrate. The ground via VIA83 is disposed in the substrate.

The filter 800 includes three resonance frequencies. A first resonance frequency is determined using a filter capacitor C51, a parasitic inductance of a ground via VIA51, and a parasitic inductance of a conducting wire between the filter capacitor C51 and the ground via VIA51. A second resonance frequency is determined using a filter capacitor C72, a parasitic inductance of a ground via VIA72, and a parasitic inductance of a conducting wire between the filter capacitor C72 and the ground via VIA72. A third resonance frequency is determined using the filter capacitor C83, a parasitic inductance of the ground via VIA83, and a parasitic inductance of a conducting wire between the filter capacitor C83 and the ground via VIA83. The foregoing three resonance frequencies are set at a frequency of a harmonic that is expected to be removed, such that the harmonic at the corresponding frequency can be filtered out.

In an implementation, the filter 800 may further include a filter inductor coupled between the first terminal of the filter capacitor C83 and a first terminal of the filter capacitor C51, to further improve filtering performance of the filter 800.

Figure 9:
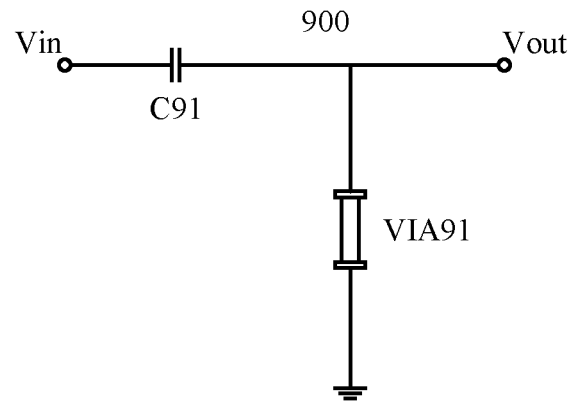
FIG. 9 is a circuit diagram of a structure of still another filter according to an embodiment of this application.

Features of the ground via not only implement a function of low pass filtering, but also implement a function of high pass filtering, band pass filtering, or band stop filtering. FIG. 9 shows still another filter 900 according to an embodiment of this application. The filter 900 can implement a function of high pass filtering. The filter 900 includes a filter capacitor C91 and a ground via VIA91. A first terminal of the filter capacitor C91 is coupled to an input terminal Vin, and a second terminal of the filter capacitor C91 is coupled to an output terminal Vout and is coupled to a first terminal of the ground via VIA91. A second terminal of the ground via VIA91 is coupled to a ground. The filter capacitor C91 is disposed in a substrate or on a surface of a substrate. The ground via VIA91 is disposed in the substrate.

It is to be understood that the filter 900 shown in FIG. 9 is merely an implementation of a filter for implementing high pass filtering. In actual application, whether to connect more ground vias in parallel or whether to connect more filter capacitors in series is determined based on a frequency of a signal that needs to be filtered out, a performance requirement, and design costs.

Figure 10:
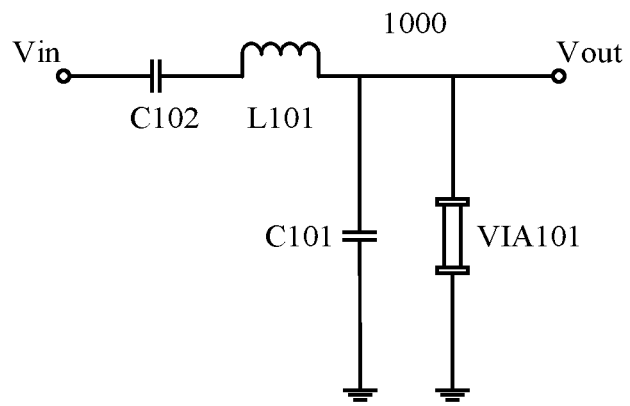
FIG. 10 is a circuit diagram of a structure of still another filter according to an embodiment of this application.

FIG. 10 shows still another filter 1000 according to an embodiment of this application. The filter 1000 can implement a function of band pass filtering. The filter 1000 includes: a filter capacitor C101, a ground via VIA101, a filter capacitor C102, and a filter inductor L101. A first terminal of the filter capacitor C101 is coupled to a ground, and a second terminal of the filter capacitor C101 is coupled to an input terminal Vin through a filter capacitor C102 and a filter inductor L101 that are connected in series and is coupled to an output terminal Vout. A first terminal of the ground via VIA101 is coupled to the second terminal of the filter capacitor C101, and a second terminal of the ground via VIA101 is coupled to the ground. The filter inductor L101, the filter capacitor C101, and the filter capacitor C102 are disposed in a substrate or on a surface of a substrate. The ground via VIA101 is disposed in the substrate.

It is to be understood that the filter 1000 shown in FIG. 10 is merely an implementation of a filter implementing band pass filtering. In actual application, whether to connect more ground vias in parallel or whether to connect more filter capacitors in series is determined based on a frequency of a signal that needs to be filtered out, a performance requirement, and design costs.

Figure 11:
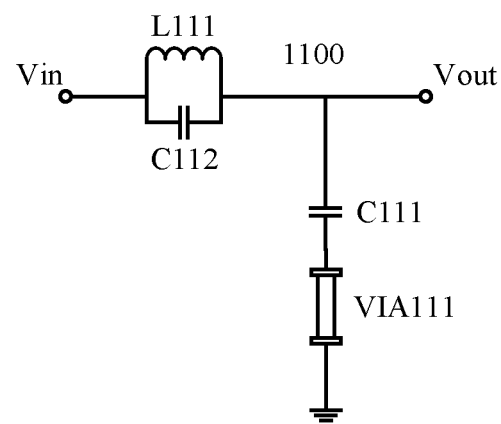
FIG. 11 is a circuit diagram of a structure of still another filter according to an embodiment of this application.

FIG. 11 shows still another filter 1100 according to an embodiment of this application. The filter 1100 can implement a function of band stop filtering. The filter 1100 includes: a filter capacitor C111, a ground via VIA111, a filter capacitor C112, and a filter inductor L111. A first terminal of the filter capacitor C111 is coupled to an output terminal Vout and is coupled to an input terminal Vin through the filter capacitor C112 and the filter inductor L111 that are connected in parallel. A first terminal of the ground via VIA111 is coupled to a second terminal of the filter capacitor C111, and a second terminal of the ground via VIA111 is coupled to a ground. The filter inductor L111, the filter capacitor C111, and the filter capacitor C112 are disposed in a substrate or on a surface of a substrate. The ground via VIA111 is disposed in the substrate.

It is to be understood that the filter 1100 shown in FIG. 11 is merely an implementation of a filter implementing band stop filtering. In actual application, whether to connect more ground vias in parallel or whether to connect more filter capacitors in series is determined based on a frequency of a signal that needs to be filtered out, a performance requirement, and design costs.

An embodiment of this application further provides a filter. The filter includes: a first filter capacitor, a filter inductor, and a first ground via. A first terminal of the first filter capacitor is coupled to an input terminal and an output terminal of the filter, and a second terminal of the first filter capacitor is coupled to a ground through the first ground via. The filter inductor is coupled between the input terminal and the output terminal. The first filter capacitor and the filter inductor are disposed in a substrate or on a surface of a substrate. The first ground via is disposed in the substrate. In an implementation, the filter inductor is coupled between the input terminal and the first terminal of the first filter capacitor. In another implementation, the filter inductor is coupled between the output terminal and the first terminal of the first filter capacitor. In one embodiment, the first filter capacitor may be C41 or C51 in the foregoing embodiment of this application, the filter inductor may be L41 or L51 in the foregoing embodiment of this application, and the first ground via may be VIA41 or VIA51 in the foregoing embodiment of this application.

The filter may further include at least one group of a second filter capacitor and a second ground via that are connected in series. A first terminal of the second filter capacitor is coupled to the input terminal of the filter and is coupled to the output terminal of the filter through the filter inductor, and a second terminal of the second filter capacitor is coupled to a ground through the second ground via. In one embodiment, the second filter capacitor may be C72 or C83 in the foregoing embodiment of this application, and the second ground via may be VIA72 or VIA83 in the foregoing embodiment of this application.

An embodiment of this application further provides a filter. The filter includes a first filter capacitor and a first ground via. A first terminal of the first filter capacitor is coupled to an input terminal of the filter, and a second terminal of the first filter capacitor is coupled to an output terminal of the filter and is coupled to a ground through the first ground via. The first filter capacitor may be C91 in the foregoing embodiment of this application, and the first ground via may be VIA91 in the foregoing embodiment of this application.

An embodiment of this application further provides a filter. The filter includes: a first filter capacitor, a first ground via, a second filter capacitor, and a filter inductor. A first terminal of the first filter capacitor is coupled to a ground, and a second terminal of the first filter capacitor is coupled to an output terminal of the filter and is coupled to an input terminal of the filter through the second filter capacitor and the filter inductor that are connected in series. A first terminal of the first ground via is coupled to the second terminal of the first filter capacitor, and a second terminal of the first ground via is coupled to the ground. The first filter capacitor may be C101 in the foregoing embodiment of this application, the first ground via may be VIA101 in the foregoing embodiment of this application, the second filter capacitor may be C102 in the foregoing embodiment of this application, and the filter inductor may be L101 in the foregoing embodiment of this application.

An embodiment of this application further provides a filter. The filter includes: a first filter capacitor, a first ground via, a second filter capacitor, and a filter inductor. A first terminal of the first filter capacitor is coupled to an input terminal through the second filter capacitor and the filter inductor that are connected in parallel and is coupled to an output terminal. A second terminal of the first filter capacitor is coupled to a ground through the first ground via. The first filter capacitor may be C111 in the foregoing embodiment of this application, the first ground via may be VIA111 in the foregoing embodiment of this application, the second filter capacitor may be C112 in the foregoing embodiment of this application, and the filter inductor may be L111 in the foregoing embodiment of this application.

An embodiment of this application further provides a radio frequency signal processing circuit. The radio frequency signal processing circuit includes a signal amplifier and a filter. An output terminal of the signal amplifier is coupled to an input terminal of the filter. The filter may be any filter according to the embodiments of this application.

The foregoing description is an implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A filter, comprising:
 an input terminal configured to receive a radio frequency signal;
 an output terminal configured to output a filtered radio frequency signal;
 a substrate comprising a surface;
 a first filter capacitor including:
  a first capacitor terminal coupled to the input terminal or the output terminal, wherein the first filter capacitor is disposed in the substrate or on the surface; and
  a second capacitor terminal;
 a ground; and
 a first ground via disposed in the substrate,
 wherein the first ground via comprises a parasitic capacitor, a parasitic inductor, and a parasitic resistor that are connected in parallel,
 wherein an inductance value of the parasitic inductor is adjusted by adjusting a height and a diameter of the first ground via,
 wherein the first ground via includes a first ground terminal coupled to the second capacitor terminal and a second ground terminal coupled to the ground, and
 wherein a dominant frequency bandwidth of the radio frequency signal is less than 100 megahertz (MHz).

2. The filter of claim 1, further comprising at least one second ground via disposed in the substrate, wherein each via in the at least one second ground via includes one terminal coupled to the second capacitor terminal and another terminal coupled to the ground.

3. The filter of claim 1, further comprising a first filter inductor disposed in the substrate or on the surface, wherein the first capacitor terminal is coupled to the output terminal, and wherein the first capacitor terminal is coupled to the input terminal through the first filter inductor.

4. The filter of claim 1, further comprising a first filter inductor disposed in the substrate or on the surface, wherein the first capacitor terminal is coupled to the input terminal, and wherein the first capacitor terminal is coupled to the output terminal through the first filter inductor.

5. The filter of claim 4, further comprising a second filter inductor disposed in the substrate or on the surface, wherein the first capacitor terminal is coupled to the input terminal through the second filter inductor.

6. The filter of claim 4, further comprising:
a second filter capacitor disposed in the substrate or on the surface, wherein the second filter capacitor includes a third capacitor terminal coupled to the output terminal, and wherein the third capacitor terminal is coupled to the input terminal through the first filter inductor; and
a third ground via disposed in the substrate, wherein the third ground via includes a third ground terminal coupled to a fourth capacitor terminal and wherein a fourth ground terminal coupled to the ground.

7. The filter of claim 6, further comprising:
a third filter capacitor disposed in the substrate or on the surface, wherein the third filter capacitor includes a fifth capacitor terminal coupled to the input terminal, and wherein the fifth capacitor terminal is coupled to the output terminal through the first filter inductor; and
a fourth ground via disposed in the substrate, wherein the fourth ground via includes a fifth ground terminal coupled to a sixth capacitor terminal and a sixth ground terminal coupled to the ground.

8. The filter of claim 7, further comprising a second filter inductor disposed in the substrate or on the surface, wherein the second filter inductor is coupled to the third capacitor terminal and the fifth capacitor terminal.

9. The filter of claim 1, wherein the first capacitor terminal is coupled to the input terminal, and wherein the second capacitor terminal is coupled to the output terminal.

10. The filter of claim 1, further comprising:
a first filter inductor disposed in the substrate or on the surface; and
a second filter capacitor including a third capacitor terminal and a fourth capacitor terminal, wherein the second filter capacitor is disposed in the substrate or on the surface, wherein the first capacitor terminal is coupled to the input terminal, wherein the second capacitor terminal is separately coupled to the output terminal, the first ground terminal, and the third capacitor terminal through the first filter inductor, and wherein the fourth capacitor terminal is coupled to the ground.

11. The filter of claim 1, further comprising:
a second filter capacitor disposed in the substrate or on the surface, wherein the first capacitor terminal is coupled to the input terminal through the second filter capacitor; and
a first filter inductor disposed in the substrate or on the surface, wherein the first filter inductor and the second filter capacitor are connected in parallel, and wherein the first capacitor terminal is coupled to the output terminal.

12. The filter of claim 1, wherein a dominant frequency range of the radio frequency signal is 1 gigahertz (GHz) to 3 GHz.

13. A radio frequency signal processing circuit, comprising:
a filter including an input terminal configured to receive a radio frequency signal;
a signal amplifier including an output terminal coupled to the input terminal, wherein the output terminal is configured output a filtered radio frequency signal;
a first filter capacitor including a first capacitor terminal coupled to the input terminal or the output terminal, wherein the first filter capacitor is disposed in a substrate or on a surface; and
a first ground via disposed in the substrate,
wherein the first ground via comprises a parasitic capacitor, a parasitic inductor, and a parasitic resistor that are connected in parallel,
wherein an inductance value of the parasitic inductor is adjusted by adjusting a height and a diameter of the first ground via,
wherein the first ground via includes a first ground terminal coupled to a second capacitor terminal of the first filter capacitor and a second ground terminal coupled to a ground, and
wherein a dominant frequency bandwidth of the radio frequency signal is less than 100 megahertz (MHz).

14. The radio frequency signal processing circuit of claim 13, wherein a dominant frequency range of the radio frequency signal is 1 gigahertz (GHz) to 3 GHz.

15. The radio frequency signal processing circuit of claim 13, further comprising at least one second ground via disposed in the substrate, wherein each via in the at least one second ground via includes one terminal coupled to the second capacitor terminal and another terminal coupled to the ground.

16. The radio frequency signal processing circuit of claim 13, further comprising a first filter inductor disposed in the substrate or on the surface, wherein the first capacitor terminal is coupled to the output terminal, and wherein the first capacitor terminal is coupled to the input terminal through the first filter inductor.

17. The radio frequency signal processing circuit of claim 13, further comprising a first filter inductor disposed in the substrate or on the surface, wherein the first capacitor terminal is coupled to the input terminal, and wherein the first capacitor terminal is coupled to the output terminal through the first filter inductor.

18. The radio frequency signal processing circuit of claim 17, further comprising a second filter inductor disposed in the substrate or on the surface, wherein the first capacitor terminal is coupled to the input terminal through the second filter inductor.

19. The radio frequency signal processing circuit of claim 17, further comprising:
a second filter capacitor disposed in the substrate or on the surface, wherein the second filter capacitor includes a third capacitor terminal coupled to the output terminal, and wherein the third capacitor terminal is coupled to the input terminal through the first filter inductor; and
a third ground via disposed in the substrate, wherein the third ground via includes a third ground terminal coupled to a fourth capacitor terminal of the second filter capacitor and a fourth ground terminal coupled to the ground.

20. The radio frequency signal processing circuit of claim 19, further comprising:
a third filter capacitor disposed in the substrate or on the surface, wherein the third filter capacitor includes a fifth capacitor terminal coupled to the input terminal, and wherein the fifth capacitor terminal is coupled to the output terminal through the first filter inductor; and a fourth ground via disposed in the substrate, wherein the fourth ground via includes a fifth ground terminal coupled to a second capacitor terminal of the third filter capacitor and a sixth ground terminal coupled to the ground.

* * * * *